United States Patent
Korhonen

(10) Patent No.: US 12,072,394 B2
(45) Date of Patent: Aug. 27, 2024

(54) POWER LEAKAGE TESTING

(71) Applicant: NORDIC SEMICONDUCTOR ASA, Trondheim (NO)

(72) Inventor: Esa Korhonen, Oulu (FI)

(73) Assignee: NORDIC SEMICONDUCTOR ASA, Trondheim (NO)

( * ) Notice: Subject to any disclaimer, the term of this patent is extended or adjusted under 35 U.S.C. 154(b) by 0 days.

(21) Appl. No.: 17/667,776

(22) Filed: Feb. 9, 2022

(65) Prior Publication Data
US 2022/0268857 A1 Aug. 25, 2022

(30) Foreign Application Priority Data

Feb. 12, 2021 (FI) ...................... 20215144

(51) Int. Cl.
*G01R 31/52* (2020.01)
*G01R 31/26* (2020.01)
*G01R 31/30* (2006.01)

(52) U.S. Cl.
CPC ......... *G01R 31/52* (2020.01); *G01R 31/2639* (2013.01); *G01R 31/3008* (2013.01)

(58) Field of Classification Search
CPC .... G01R 31/52; G01R 31/30; G01R 31/3004; G01R 31/3008; G01R 31/2639; G01R 19/165; G01R 31/2884
See application file for complete search history.

(56) References Cited

U.S. PATENT DOCUMENTS

| | | | |
|---|---|---|---|
| 6,882,172 B1 | 4/2005 | Suzuki et al. | |
| 6,885,210 B1 * | 4/2005 | Suzuki | G01R 31/2621 |
| | | | 324/762.01 |
| 7,038,483 B1 * | 5/2006 | Suzuki | G01R 31/52 |
| | | | 324/762.09 |
| 7,235,998 B1 | 6/2007 | Suzuki | |
| 7,336,088 B2 * | 2/2008 | Rius Vazquez | G01R 31/3008 |
| | | | 324/762.09 |
| 9,863,994 B2 * | 1/2018 | Cher | G01R 19/165 |
| 11,215,664 B1 * | 1/2022 | Yun | G01R 31/2884 |

FOREIGN PATENT DOCUMENTS

WO 2004/027438 4/2004

OTHER PUBLICATIONS

Search Report for FI 20215144 dated Oct. 6, 2021, 1 page.

* cited by examiner

*Primary Examiner* — Judy Nguyen
*Assistant Examiner* — James Split
(74) *Attorney, Agent, or Firm* — Nixon & Vanderhye PC

(57) ABSTRACT

This document discloses a power leakage sensor for a circuit, comprising: a power switch controller circuit coupled with at least one power switch for the digital circuit, the power switch controller configured to control the at least one power switch, to monitor power supply of the digital circuit, and to perform the following: a. in response to the detecting that the power supply to the circuit is powered on, output a power-off signal to the at least one power switch; and b. in response to the measured power supply metric falling below a threshold in response to the power-off signal, output a power-on signal to the at least one power switch. The power leakage sensor further comprises a frequency counter circuit configured to count a frequency of executing steps a. and b., the frequency indicating a proportion of power leakage in the digital circuit.

12 Claims, 6 Drawing Sheets

POWER LEAKAGE TESTING

TECHNICAL FIELD

Various example embodiments described herein relate to testing an electronic circuit for power leakage.

BACKGROUND

Integrated circuits are conventionally tested for malfunctions such as power (current) leakage. The power leakage may result from faults in a manufacturing process, for example. For complementary metal-oxide semiconductor (CMOS) digital circuits, IDDQ testing is often used. IDD refers to the power supply current while Q refers to a 'quiescent' state of the circuit during the testing. It means that the circuit is typically held at a static state for the testing. IDDQ testing is based on an assumption that, in a correctly operating quiescent CMOS digital circuit, there is no static current path between the power supply and the ground, except for a small amount of leakage. Common semiconductor manufacturing faults cause substantial current leakage that can be distinguished via testing.

With the reduction of the linewidth and resulting increase in the number of CMOS logic gates, modern CMOS circuits introduce ever increasing background leakage which makes it harder to detect defects by using conventional leakage current measurements exercised via a power supply pin of the CMOS digital circuit.

BRIEF DESCRIPTION

According to an aspect, there is provided a power leakage sensor for a circuit, comprising:
  a power switch controller circuit coupled with at least one power switch for the digital circuit, the power switch controller configured to control the at least one power switch, to monitor power supply of the digital circuit, and to perform the following:
  a. in response to the detecting that the power supply to the circuit is powered on, output a power-off signal to the at least one power switch; and
  b. in response to the measured power supply metric falling below a threshold in response to the power-off signal, output a power-on signal to the at least one power switch;
  a frequency counter circuit configured to count a frequency of executing steps a. and b., the frequency indicating a proportion of power leakage in the digital circuit.

An advantage of providing the power leakage sensor in the form of the power switch controller circuit and the frequency counter circuit is that no additional sensor components need to be added to the power supply line. Accordingly, the sensor does not reduce a voltage headroom of the digital circuit.

In an embodiment, the circuit is a digital circuit, and the at least one power switch, the power switch controller circuit, the frequency counter circuit, and the digital circuit are integrated into the same die. An advantage is that the built-in leakage sensor reduces the number of external connections required for testing.

In an embodiment, the power switch controller circuit comprises a comparator configured to compare the power supply metric with the threshold. The use of a comparator is simple to design yet an effective solution for producing a signal measurable by the frequency counter circuit.

In an embodiment, the power supply metric measured for steps a. and b. indicates a power supply voltage in the digital semiconductor circuit after the at least one power switch. The power supply voltage can be measured directly from the power supply line and behaves proportionally to the leakage, thus providing an effective solution for measuring the leakage.

In an embodiment, the power leakage sensor circuit comprises a processing circuit configured to map said frequency to a power leakage value. A technical effect is the provision of a metric that directly represents the power leakage.

In an embodiment, the power switch controller circuit is further coupled to an output of the at least one power switch, and configured to receive an acknowledgement to the power-on signal from the at least one power switch, and to detect that the power supply to the circuit is powered on from the acknowledgment. A technical effect is that the power switch controller circuit gains information on the state of the power switch(es) for the purpose of measuring the leakage.

In an embodiment, the power switch controller circuit is further configured to measure a time interval comprising at least a time between the power-on signal and the respective acknowledgement, and wherein the processing circuit is configured to reduce the effect of the measured time interval from said frequency. A technical effect is that the propagation delay of responding to the power-on signal can be reduced from the measurements, thus improving the accuracy of the leakage measurements.

In an embodiment, the processing circuit is configured to switch the power switch controller circuit between a first measurement mode and a second measurement mode, wherein the power switch controller circuit is configured in first measurement mode to measure the power supply metric and in the second measurement mode to measure the time interval. A technical effect is that the same circuit can be used for both measurements, thus reducing the complexity of the power switch controller circuit.

In an embodiment, the circuit comprises a plurality of sub-circuits, each sub-circuit having an independent power supply, wherein the at least one power switch comprises a plurality of power switches configured to provide the independent power supply to each of the plurality of sub-circuits, and wherein the power switch controller circuit is configured to perform the steps a. and b. independently for each of the plurality of sub-circuits. A technical effect is that each sub-circuit can be tested independently which improves the leakage testing in scenarios where the sub-circuits have logic gates with different power switches, for example. A corresponding advantage is that interference to the testing caused by the different types of sub-circuits can be reduced, thus improving the performance of the leakage measurements.

According to an aspect, there is provided a testing system comprising: the power leakage sensor circuit of any embodiment described above, and a test controller circuit configured to:
  i. output a scan vector to the digital circuit, the scan vector defining states for logic gates of the digital circuit, and
  ii. upon outputting the scan vector, control the power switch controller to execute steps a. and b. and the frequency counter circuit to measure the frequency,
  wherein the test controller circuit is configured to repeat steps i. and ii. for a plurality of different scan vectors.

According to an aspect, there is provided a computer-implemented method for testing a digital circuit, comprising: outputting, by a test controller, a scan vector to the digital circuit, the scan vector defining states for logic gates of the digital circuit; controlling, by the test controller, the power leakage sensor circuit of any one of the above-described embodiments to carry out the steps a. and b. described above and to count the frequency of executing the steps a. and b.; and computing, on the basis of the counted frequency, a power leakage metric indicating power leakage in the digital circuit.

In an embodiment, the computer-implemented method further comprises repeating said controlling and computing steps for a plurality of different scan vectors.

According to yet another aspect, there is provided a computer program product embodied on a computer-readable medium and comprising a computer program code readable by a computer, wherein the computer program code configures the computer to carry out a computer process comprising all the steps any one of the computer-implemented methods described above.

The embodiments and features, if any, described in this specification that do not fall under the scope of the independent claims are to be interpreted as examples useful for understanding various embodiments of the invention.

BRIEF DESCRIPTION OF DRAWINGS

In the following, example embodiments will be described in greater detail with reference to the attached drawings, in which.

DETAILED DESCRIPTION OF SOME EMBODIMENTS

The following embodiments are examples. Although the specification may refer to "an", "one", or "some" embodiment(s) in several locations, this does not necessarily mean that each such reference is to the same embodiment(s), or that the feature only applies to a single embodiment. Single features of different embodiments may also be combined to provide other embodiments. Furthermore, words "comprising" and "including" should be understood as not limiting the described embodiments to consist of only those features that have been mentioned and such embodiments may contain also features/structures that have not been specifically mentioned.

Figure 1:
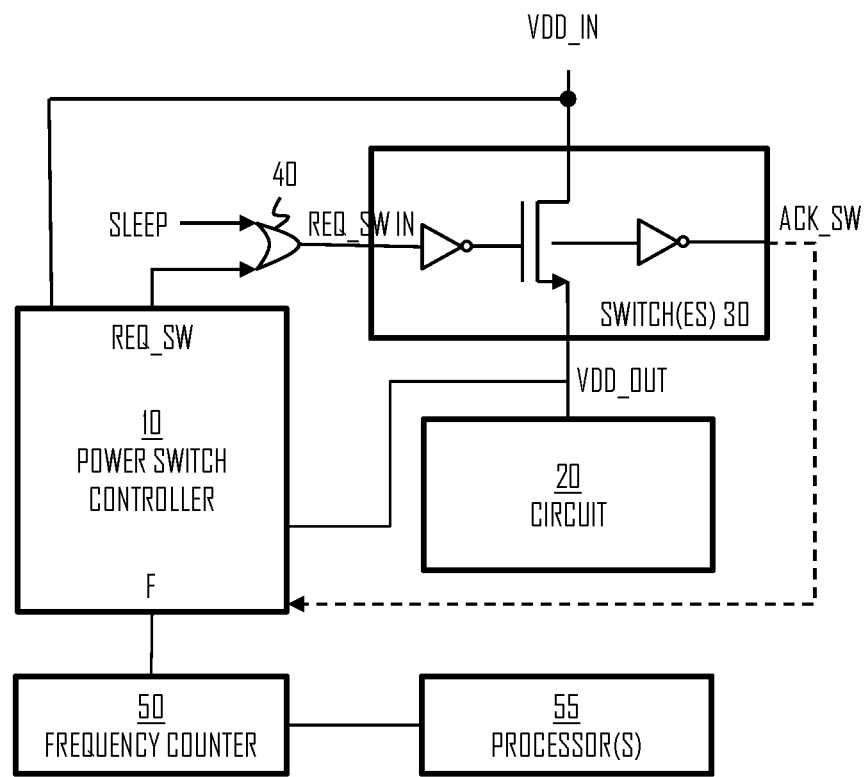
FIG. 1 illustrates a power leakage sensor according to an embodiment.

FIG. 1 illustrates a circuitry to which embodiments of the invention may be applied. In an embodiment, there is provided a power leakage sensor for a circuit 20. The power leakage sensor may be configured to measure power leakage in a digital circuit or an analogue circuit, generally an electronic circuit. The digital circuit 20 may comprise digital logic gates in an integrated circuit. Examples of the digital logic gates are complementary metal oxide semiconductor (CMOS) gates. The analogue circuit may comprise analogue components such as resistors, capacitors, inductors, and/or other analogue electronic components. A supply voltage may be applied to the circuit via at least one power switch 30. FIG. 1 illustrates one power switch that may control power supply to different regions of the circuit 20. However, the number of switches controlling the power supply may be higher than one, e.g. the power switches 30 may be arranged in series along a single power supply line. An input power supply voltage VDD_IN may be applied to a power supply input of the power switch(es) 30 while VDD_OUT represents the power supply voltage to the circuit 20. The switch(es) 30 is/are configured to connect and disconnect the power supply input to/from the digital circuit. Accordingly, the circuit 20 may be powered up or down by operating the power switch(es), in normal operation of the circuit 20, the control of the power switch(es) may be realized by a sleep signal SLEEP input to the power switches 30 by a system controller.

Now, for the purpose of measuring the power leakage in the digital circuit, the power leakage sensor may comprise a power switch controller circuit 10 and a frequency counter circuit 50. The power switch controller circuit is coupled with the at least one power switch and configured to control the at least one power switch. Further, the power switch controller circuit is configured to measure a power supply metric of the circuit 20, and to perform the following:

a. in response to the detecting that the power supply to the circuit is powered on, output a power-off signal to the at least one power switch; and b. in response to the measured power supply metric falling below a second threshold in response to the power-off signal, output the power-on signal to the at least one power switch.

The frequency counter circuit 50 may be a digital frequency counter circuit that is configured to count a frequency of executing the above steps a. and b., the frequency indicating a proportion of power leakage in the digital circuit. A state-of-the-art frequency counter may be used.

An advantage of providing the power leakage sensor in the form of the power switch controller circuit and the frequency counter circuit is that no additional sensor components need to be added to the power supply line. Accordingly, the sensor does not reduce a voltage headroom of the digital circuit.

Referring to FIG. 1, the power switch controller may thus output a request REQ_SW to switch the state of the power switches (power-on or power-off). The request may be delivered via an OR logic gate 40 having the SLEEP signal as another input. In the normal operation, the signal REQ_SW may be kept in a low signal level. The request is then delivered to the power switches 30. In the embodiment of FIG. 1, the switch(es) 30 are arranged in series so the request is delivered from one switch to another and, as a response, the states of the switches is changed. The power supply output VDD_OUT to the circuit is correspondingly switched on or off. The power supply metric such as the power supply output VDD_OUT is then measured by the power switch controller and used as an input for triggering the subsequent request REQ_SW. In this manner, the power switch controller circuit 10 switches the power switches on and off with a frequency that is proportional to a delay to respond to the request, as measured from the power supply metric. The frequency is measured by the frequency counter circuit 50.

As described above, the power supply metric indicates the power leakage via the switching frequency. In the case where the power supply metric is the power supply voltage at the output of the switches 30, the frequency is directly proportional to the power leakage: higher frequency indicates higher power leakage in the digital circuit.

An output of the frequency counter circuit 50 may be coupled to at least one processor 55 or, equivalently, a processing circuitry configured to convert the frequency into a power leakage metric that indicates the amount of power leakage. The conversion may be based on a mapping table stored in a memory accessible to the processor(s). Since the frequency may depend on characteristics of the digital circuit, e.g. the number of logic gates in the digital circuit, digital circuits of different design may provide the same frequency but still one may be operating validly while the other is defective. Therefore, the mapping table or the conversion logic to convert the measured frequency to the power leakage metric may be designed uniquely to the digital circuit. Some embodiments related to the conversion are described below.

Figure 2:
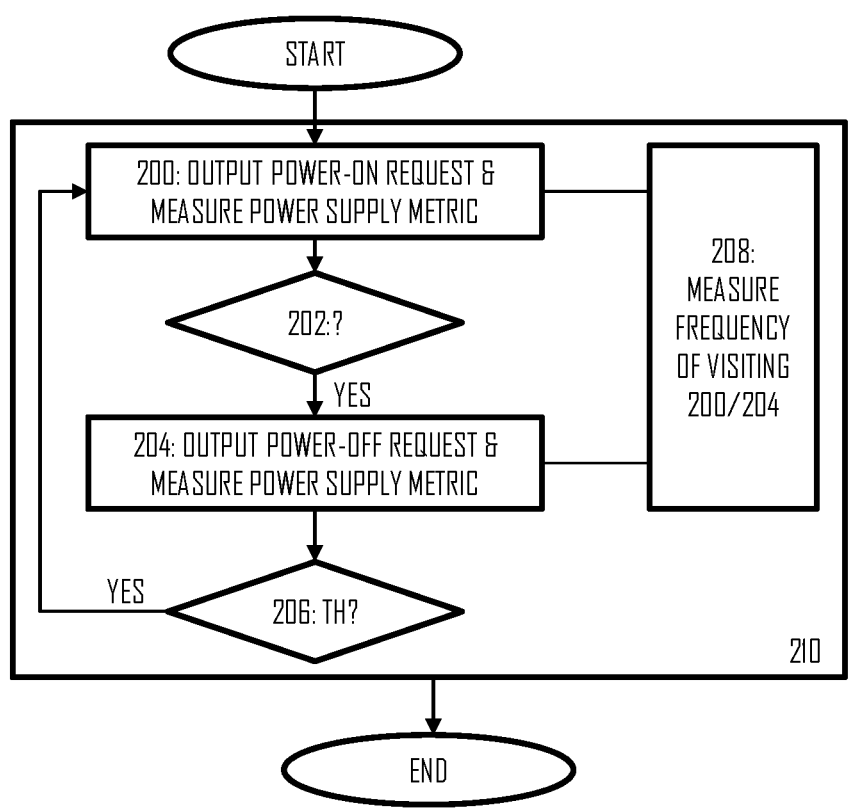
FIG. 2 illustrates operation of the power leakage sensor according to an embodiment.

FIG. 2 illustrates a flow diagram for a method performed by the power leakage sensor of FIG. 1. Referring to FIG. 2, let us describe a process 210 of measuring power leakage of the digital circuit. In block 200, the power switch controller circuit outputs a power-on request to the power switches and monitors the power supply responsive to the power-on request. The monitoring may be based on monitoring the power supply metric or operation of the power switches, as described in greater detail below. In block 202, the power switch controller detects that the power supply to the circuit is powered on. Upon detecting that the circuit is powered up, the power switch controller proceeds to block 204 where the power-off request is output to the power switches and the power supply metric is measured and compared with the threshold in block 206. When the power supply metric drops below the threshold, the process returns to block 200 for the power-up of the power supply. In this manner, the power supply is switched on and off proportionally to the speed at which the power supply metric drops in response to the power-off, thus producing the power switching frequency measured by the frequency counter in block 208. The frequency counter may actually measure the number of times the block 200 or 204 is visited per time unit, which is proportional to the degree of power leakage.

In an embodiment, the at least one power switch, the power switch controller circuit, the frequency counter circuit, and the circuit are integrated into the same die. In other words, the leakage sensor may be built-in leakage sensor manufactured on the same die with the circuit that is being tested. As described in embodiments below, the complexity of the leakage sensor is low which results in that it requires a very small area of the die.

In an embodiment, the circuit 20 comprises a plurality of sub-circuits or 'domains'. The domain may be understood as a sub-circuit that has an independent power supply and associated power switch(es). In this case, multiple switches may be used to provide the independent power supply, e.g. each sub-circuit may have a set of one or more power switches dedicated to the sub-circuit. A separate power leakage sensor may be provided for each domain, e.g. integrated together with each domain. From another perspective, the power switch controller circuit may comprise multiple power switch controller circuits according to any one of the embodiments described herein and configured to perform the steps a. and b. independently for each of the plurality of sub-circuits. In another embodiment, one power leakage sensor may be configured to test multiple domains by coupling the power leakage sensor to the multiple domains by using multiplexers. The multiplexers may be used to control the domains to be tested. An advantage solved by per-domain testing of the circuit 20 is that both high-speed logic and low-speed logic can be tested for the leakage from the same power supply pin. The high-speed logic may employ a different power switch or switches than the low-speed logic. Conventionally, the testing from the same supply pin has been difficult because background leakage of the high-speed logic may mask faults of the low-speed and low leakage logic. If logic gates with different supply voltages or speed are behind independent power switches, the leakage current can be measured individually for both logic types even if all logic gates are powered up at the same time.

In an embodiment, the power switch controller circuit comprises a comparator configured to compare the power supply metric with the threshold.

Figure 3:
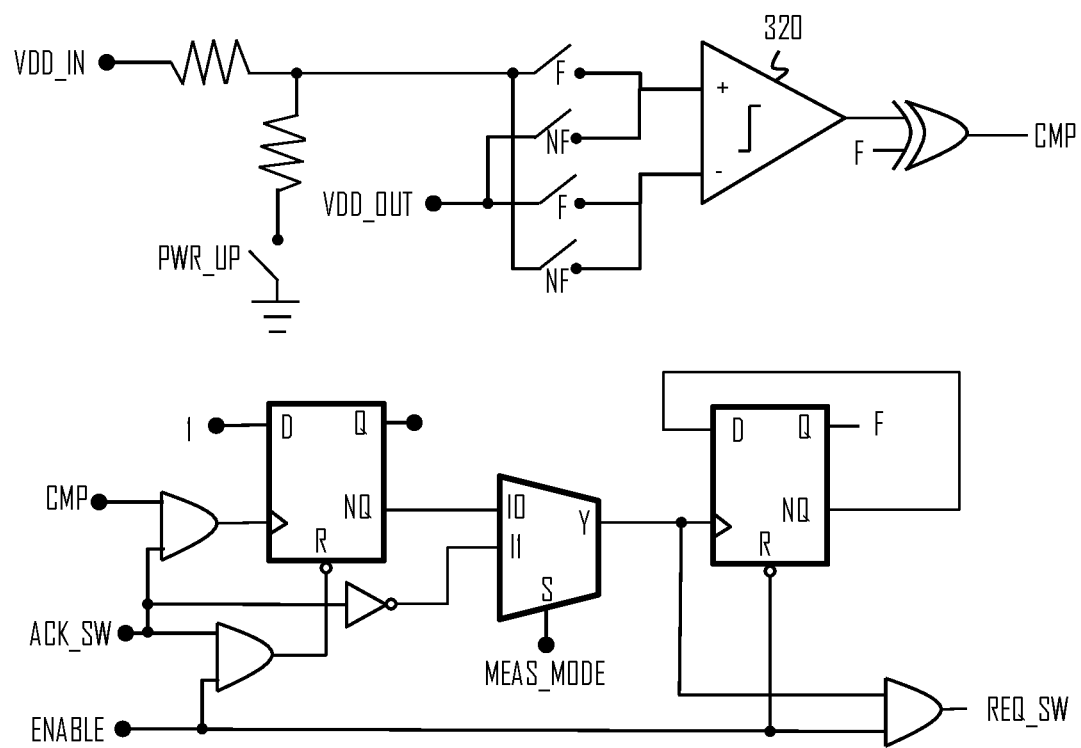
FIG. 3 illustrates a circuit diagram of a power switch controller circuit according to an embodiment.
Figure 4:
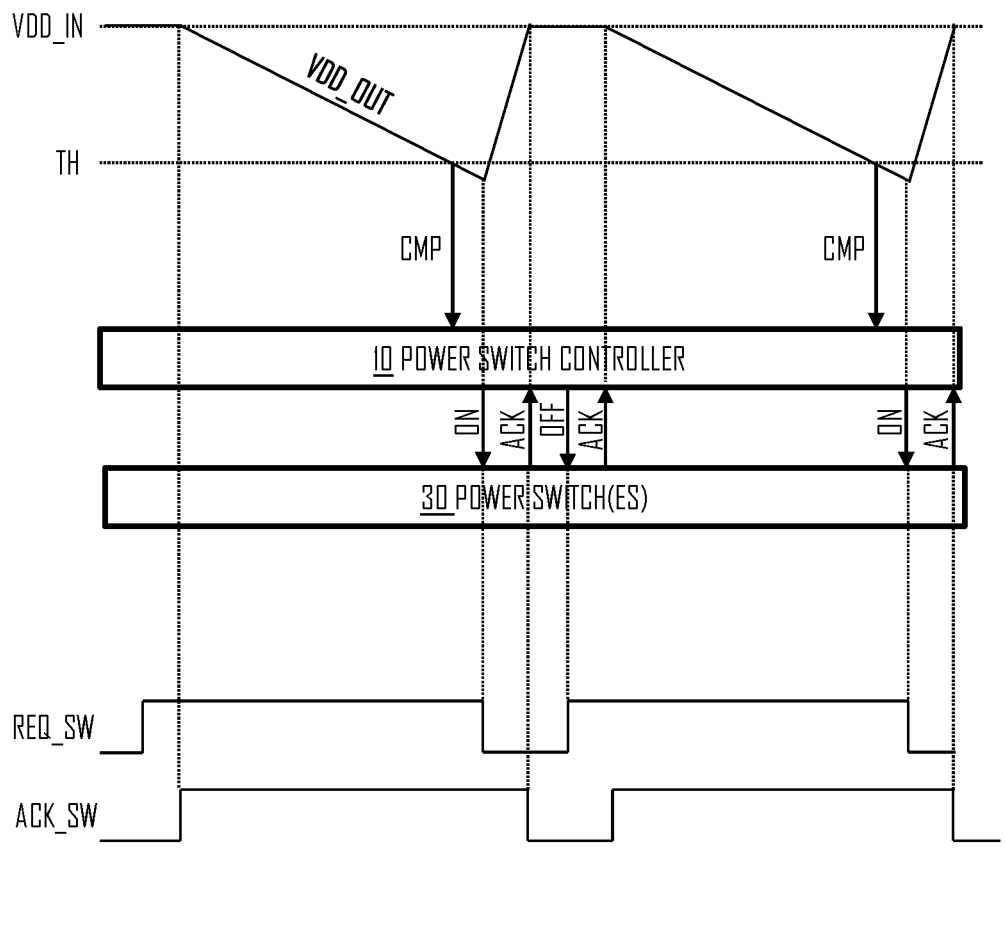
FIG. 4 illustrates a timing diagram illustrating the operation of a power switch controller circuit according to an embodiment.

Let us then describe some embodiments with reference to a detailed circuit diagram of the power leakage sensor in FIG. 3 and a timing diagram of FIG. 4. Let us first describe the circuit diagram of FIG. 3. As described above, the comparison between the power supply metric and the threshold may be performed by a comparator 320. Inputs to the comparator may include the measured power supply metric, e.g. the power supply voltage VDD_OUT of the circuit 20 that directly indicates the power supply voltage in the circuit 20. In response to the power-off signal, VDD_OUT reduces in the circuit proportionally to the power leakage in the digital circuit. The higher the power leakage in the digital circuit, the more routes for the current to flow in the circuit and the faster VDD_OUT reduces. Another input to the comparator may be a reference voltage defining the threshold. The reference voltage may be defined by the power supply voltage VDD_IN and design of the impedance(s) (e.g. the illustrated resistive divider) illustrated at the input to the comparator in FIG. 3. The reference voltage may be selected so that the voltage drop at VDD_OUT does not cause logic gates to change their states inside the circuit 20 so that the static state of the circuit is maintained for the duration of the (IDDQ) testing. For example, the reference voltage may be designed so that it does not allow VDD_OUT to drop below a determined level, thus enabling the static state of the circuit 20. A switch controlled by a control signal PWR_UP may be used to control the impedance. As described above, the comparator may be configured to change its output in response to the VDD_OUT dropping below the reference voltage, thus outputting a change in the output signal CMP.

The comparator may introduce an offset to the comparison because of its non-ideal characteristics. This offset may be cancelled by swapping inputs of the comparator and inverting output for every other cycle. The swapping is realized by the switches controlled by signal F having the measured frequency and its inversion NF, while the output inversion is realized by an exclusive OR (XOR) gate at the output of the comparator 320. Another input to the XOR gate may be the signal F. As a consequence, the swapping frequency follows the measured frequency.

The lower half of FIG. 3 illustrates how the comparator output converts to the request for switching the power supply on and off. As illustrated by the dashed line in FIG. 1, one input to the power switch controller circuit may be from the power switches, and the signal delivered via this signal line may be an acknowledgment signal ACK_SW that acknowledges the power-on and power-off signals input to the power switches. As illustrated in FIG. 1, the power-on or power-off signal REQ_SW may travel through every power switch and, ultimately, be output as the acknowledgment signal ACK_SW that acknowledges that the power-on or power-off signal has travelled through every power switch and that every power switch has been switched on or off, respectively. The ACK_SW and the CMP signals may be routed via an AND gate so that a change in both signals is needed to induce a change in the output of the AND gate and in the input of the left-most D flip-flop. Signal ENABLE is an enablement signal enabling the operation of the power switch controller circuit. This change in the input of the D flip-flop also changes (inverts) the output of the D flip-flop, and the output is then delivered via a multiplexer (described below) and output as the REQ SW signal (via an AND gate having the ENABLE as another input). The output of the D flip-flop is also applied to an input of a second D flip-flop that outputs the signal F representing the frequency and the signal output to the frequency counter circuit and to swap the comparator inputs.

Let us then describe the operation of the circuit of FIG. 3 with reference to the timing diagram of FIG. 4. The timing diagram illustrates a time interval during the operation of the power switch controller circuit 10 and the power switch(es) 30 under the control of the power switch controller circuit. Let us start from a state where the REQ_SW signal is put to 'high' logic state, as illustrated as the initial state in FIG. 4. In this embodiment, the high logic state corresponds to the power-off signal. Shortly thereafter, ACK_SW also takes the 'high' logic state, indicating that the power switches have been switched off. As a response, VDD_OUT starts declining. VDD_OUT is measured and compared with the threshold TH by the comparator and, upon VDD_OUT falling below the threshold, the comparator changes the state of the CMP signal to 'high' logic state. Since both inputs to the left-most AND gate in FIG. 3 are now high, high is passed to the input of the left-most D flip-flop (can equally be a D latch). Correspondingly, the D flip-flop now outputs low' logic state which is delivered to the input of the right-most AND gate. This causes the output of the AND gate to go low, thus resulting in the low logic state of the signal REQ_SW. The low state of REQ_SW corresponds to the power-on signal illustrated by 'ON' from the power switch controller 10 to the power switches in FIG. 4. When the REQ_SW has travelled through all the power switches, the signal AC_SW switches to the low state as well, and the power switch controller 10 receives the acknowledgment (ACK) from the power switches via the change of logic state (to 'low') of ACK_SW. Since ACK_SW goes low, also output of the left-most AND gate goes low in FIG. 3, thus resulting in that the left-most D flip-flop outputs a high logic state that is delivered to the output as a new state of REQ_SW, thus causing output of the power-off signal. The right-most D flip-flop follows these changes of states and, accordingly, the signal F may be used to measure the frequency at which the states change. In this manner, the leakage power sensor oscillates as a function of the power leakage in the digital circuit.

For the purpose of measuring the power leakage in the digital circuit, the circuit 20 can be understood as capacitance ($C_{supply}$) which is discharged by a constant current leakage ($I_{leakage}$). If $\Delta V$ is difference between VDD_OUT and the comparator threshold voltage TH, a time interval needed to discharge the circuit by $\Delta V$ is $$T_{discharge} = \Delta V \cdot C_{supply} / I_{leakage}.$$

The capacitance scales with number of gates in the circuit and, therefore, $T_{discharge}$ is substantially similar between different sized domains as long as they are using similar logic type. However, a characteristic that may impact the linearity of leakage measurements is a propagation delay between the transmission of the signal REQ_SW and the reception of the ACK_SW, or even between the time instant when the power leakage metric drops below the threshold and the transmission of the subsequent power-off signal (power-on signal being transmitted there between). Referring to FIG. 4, the propagation delay may start from the time instant denoted by CMP, i.e. the time instant when the VDD_OUT drops below the TH. Subsequent transmission of the power-on signal and the following operation of the power switch(es) to the on state are included in the propagation delay, as well as the following transmission of the power-off signal and, optionally, the reception of the acknowledgment to the power-off signal.

Figure 5:
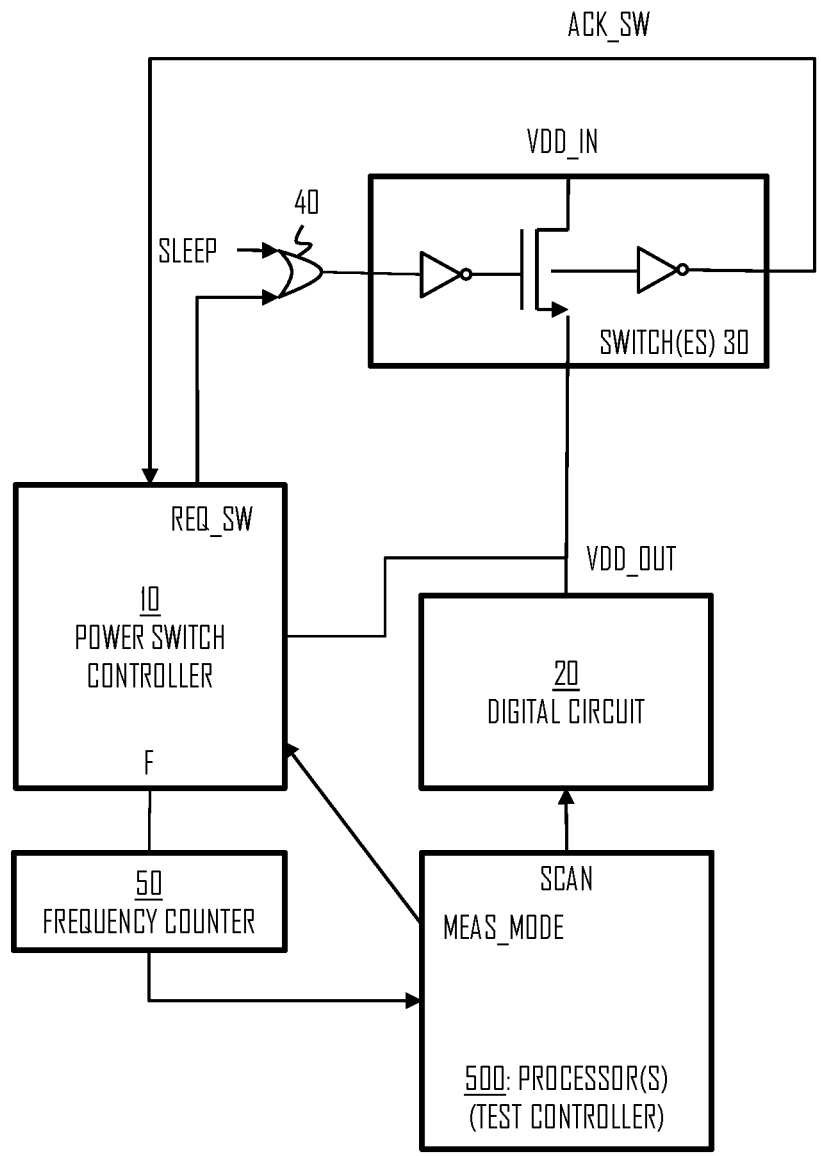
FIG. 5 illustrates a test system according to an embodiment.

This is illustrated in FIG. 5. An actual time period of the output F of the power switch controller can be defined by the following Equation:

$$T_{measured} = T_{discharge} + T_{delays},$$

where $T_{measured}$ represents a duty cycle of the signal F (indicates directly the frequency), $T_{discharge}$ is a discharge time of the circuit and the desired parameter describing the power leakage in the digital circuit, and $T_{delays}$ represents the propagation delay. In order to determine the discharge time and the power leakage accurately, it would be beneficial to know $T_{delays}$ before solving $I_{leakage} = \Delta V \cdot C_{supply} / (T_{measured} - T_{delays})$. If $T_{delays}$ was omitted, satisfactory results may still be acquired in some implementations. For example, the results between different measurement configurations applied to the same circuit would still be comparable. When the propagation delay is taken into account, measurement results between different dies or from wafers becomes more accurate.

The circuit diagram of FIG. 3 illustrates a measurement configuration for measuring the propagation delay. The multiplexer may be operated between two measurement modes: a first measurement mode for measuring the comparator output, i.e. duty cycle $T_{measured}$ (I0 connected) and a second measurement mode for measuring the propagation delay $T_{delays}$ (I1 connected). Referring to FIG. 3, the illustrated inverter becomes connected in the second measurement mode, forming a ring-oscillator circuit having an oscillation frequency inversely proportional to the propagation delay. The propagation delay can then be measured from the output signal F in the second measurement mode. The propagation delay from the power-on to the acknowledgement of the power-off signal can be computed by multiplying the duty cycle of the signal F by two. This is equivalent to dividing the frequency represented by F by two and, then, computing the resulting duty cycle. The processor 55 may control the measurement modes. Accordingly, the processor 55 may use the second measurement mode to acquire the propagation delay $T_{delays}$, the first measurement mode to acquire the comparator output $T_{measured}$, and then compute the current leakage by solving the following equation:

$$I_{leakage} = \Delta V \cdot C_{supply} / (T_{measured} - T_{delays})$$

where $\Delta V$ is the difference between the VDD_OUT and the comparator threshold TH, and $C_{supply}$ may be a predetermined constant representing the capacitance formed by the circuit or, from one perspective, by a power supply network of the digital circuit.

In general, the power switch controller circuit is thus configured to measure a time interval comprising at least a time between the power-on signal and the respective acknowledgement, and wherein the processor 55 is configured to reduce the effect of the measured time interval from said frequency.

Further generalizing the description of the measurement modes, the processor may be configured to switch the power switch controller circuit between the first measurement mode and the second measurement mode, wherein the power switch controller circuit is configured in first measurement mode to measure the power supply metric and in the second measurement mode to measure the time interval.

As described in Background, the embodiments described above may be used in the IDDQ testing in the field of testing digital circuits. The basic principle is to arrange the circuit into various states and run the testing in each of the various states. The testing may be carried out by inputting a scan vector into the digital circuit, the scan vector causing the logic gates in the circuit to take determined states, and then running the test such as the power leakage test according to any one of the above-described embodiments.

Figure 6:
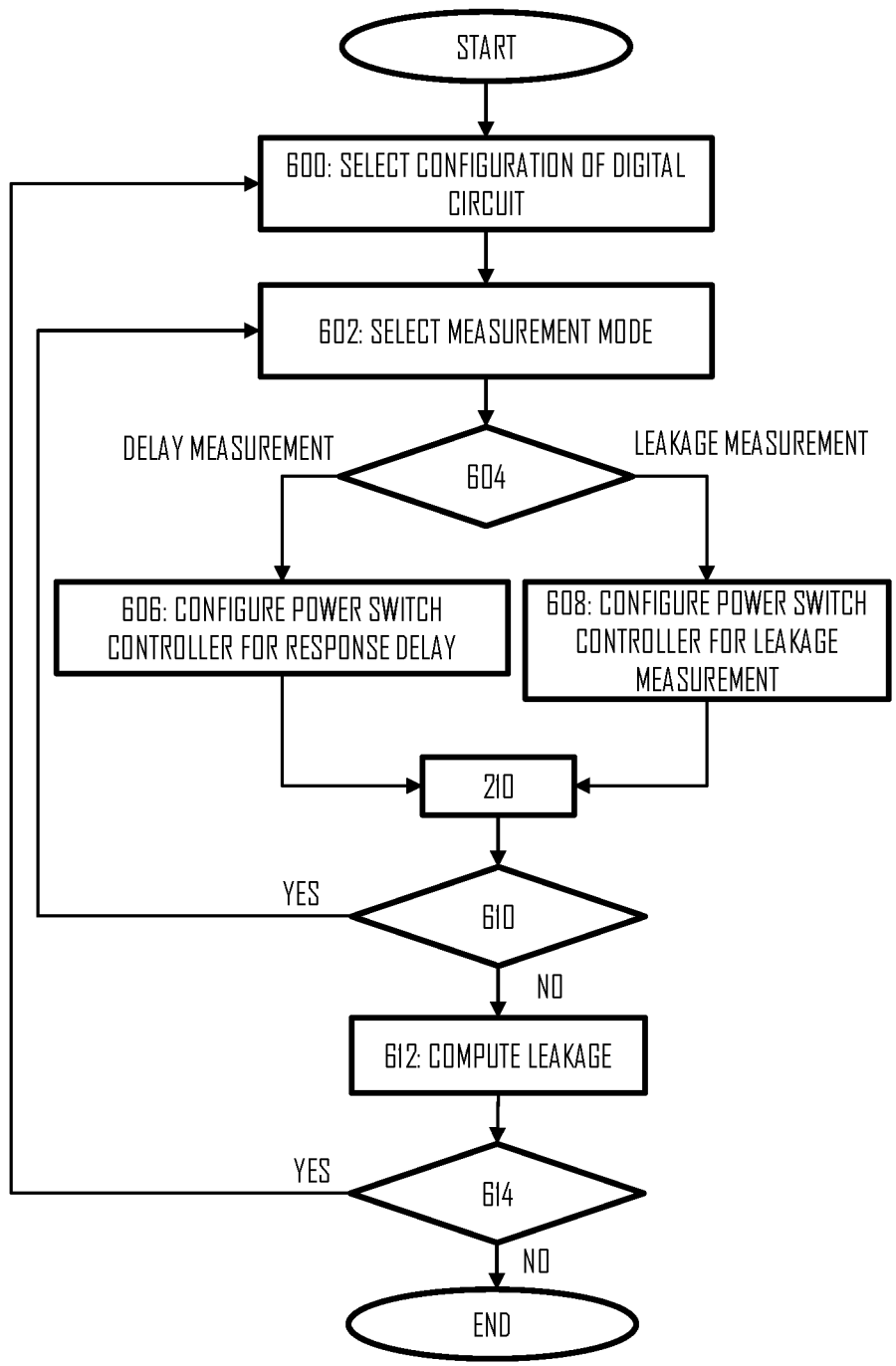
FIG. 6 illustrates an embodiment of a process for testing a circuit for power leakage.

FIG. 5 illustrates a system for performing the testing with various scan vectors, and FIG. 6 illustrates a corresponding process. Referring to FIG. 5, the system comprises the power switch controller 10 and the frequency counter 50 used for testing the circuit 20 by operating the power switch(es) 30 switching the power supply to the circuit 20. The system may further comprise a test controller 500 that may be realized by the processor(s) 55, or it may be a separate test controller. As described above, the test controller 500 may control the measurement mode of the power switch controller with the signal MEAS_MODE. When the test controller comprises the processor, the test controller may receive the frequency counted by the frequency counter 50 for the purpose of determining the power leakage by using, in some embodiments, the propagation delay.

As described above, the test controller circuit may be configured to:
  i. output a scan vector to the digital circuit, the scan vector defining states for logic gates of the digital circuit, and
  ii. upon outputting the scan vector, control the power switch controller circuit to execute steps a. and b. and the frequency counter circuit to measure the frequency, and repeat steps i. and ii. for a plurality of different scan vectors. FIG. 6 illustrates a flow diagram of such a process.

Referring to FIG. 6, the test controller may select a configuration of the circuit (the scan vector) in block 600. The scan vector may also be input to the circuit in block 600 In blocks 602 and 604, the measurement mode for the power switch controller circuit is selected amongst the first measurement mode (leakage measurements) and the second measurement mode (propagation delay measurements). The second measurement mode may be carried out only once per circuit because it stays substantially constant for the different scan vectors. Upon selecting the propagation delay measurement, the appropriate signal MEAS_MODE is input to the power switch controller circuit in block 606, e.g. to control the multiplexer of FIG. 3 to select input 11. Thereafter, the process of FIG. 2 (block 210) is carried out and the output of the frequency counter 50 is collected by the processor(s). In block 610, it is determined whether or not to change the measurement mode. The decision may be based on whether or not both measurement modes have already been carried out. If the test controller determines that the measurement mode shall be changed, the process returns to block 602 to select the other measurement mode. With the assumption that the propagation delay measurements were selected and the power leakage measurement have not yet been carried out, the power leakage measurements may be selected in blocks 602 and 604. As a consequence, the appropriate signal MEAS_MODE is input to the power switch controller circuit in block 608, e.g. to control the multiplexer of FIG. 3 to select input 10. Thereafter, the process of FIG. 2 (block 210) is carried out and the output of the frequency counter 50 is collected by the processor(s). Now that the processor(s) has/have all the measurement data for the computation of the power leakage, the power leakage metric may be computed in block 612. Thereafter, the test controller may determine whether to run the testing for another configuration of the circuit (for a different scan vector). If another scan vector shall be applied, the process returns to block 600 for another iteration with the other scan vector. As described above, the propagation delay measurements may be omitted for some of the scan vectors. The propagation delay measurements may be carried out for the first scan vector or the last scan vector, for example, although the propagation delay measurement may be carried out for any one or more of the scan vectors. If all the scan vectors in the testing configuration have been executed, the process may end. In some embodiments, the processor may then compute the final power leakage metric from the power leakage metrics computed in connection with the various scan vectors.

In the embodiments not using the propagation delay measurements, blocks 602, 604, and 606 may be omitted. In the embodiments using the propagation delay measurements, the order of carrying out the first and second measurement mode may be arbitrary.

As used in this application, the term 'circuitry' refers to one or more of the following: hardware-only circuit implementations such as implementations in only analogue and/or digital circuitry; combinations of hardware circuits and software and/or firmware; and circuits such as a microprocessor(s) or a portion of a microprocessor(s) that require software or firmware for operation, even if the software or firmware is not physically present. This definition of 'circuitry' applies to uses of this term in this application. As a further example, as used in this application, the term "circuitry" would also cover an implementation of merely a processor (or multiple processors) or portion of a processor, e.g. one core of a multi-core processor, and accompanying software and/or firmware. The term "circuitry" would also cover, for example and if applicable to the particular element, a baseband integrated circuit, an application-specific integrated circuit (ASIC), and/or a field-programmable grid array (FPGA) circuit for the apparatus according to an embodiment of the invention.

The processes or methods described in connection with FIG. 6, or any of the embodiments thereof may also be carried out in the form of one or more computer processes defined by one or more computer programs. The computer program(s) may be in source code form, object code form, or in some intermediate form, and it may be stored in a carrier or a distribution medium, which may be any entity or device capable of carrying the program. Such carriers include transitory and/or non-transitory computer media, e.g. a record medium, computer memory, read-only memory, electrical carrier signal, telecommunications signal, and software distribution package. Depending on the processing power needed, the computer program may be executed in a single electronic digital processing unit or it may be distributed amongst a number of processing units.

Embodiments described herein are applicable to radio devices defined above but also to other implementations. The specifications of the radio devices, in particular radio protocols, memory structures etc. develop rapidly. Such development may require changes to the described embodiments. Therefore, all words and expressions should be interpreted broadly and they are intended to illustrate, not to restrict, the embodiment. It will be obvious to a person skilled in the art that, as technology advances, the inventive concept can be implemented in various ways. Embodiments are not limited to the examples described above but may vary within the scope of the claims.

The invention claimed is:

1. A power leakage sensor for a circuit, comprising:
a power switch controller circuit coupled with at least one power switch having a power output providing a power supply for a digital circuit, the power switch controller circuit being configured to control the at least one power switch, to monitor the power supply of the digital circuit, and to perform the following:
   a. in response to detecting that the power supply to the digital circuit is powered on, output a power-off signal to the at least one power switch; and
   b. in response to a measured power supply metric falling below a threshold in response to the power-off signal, output a power-on signal to the at least one power switch; and
a frequency counter circuit configured to count a frequency of executing (a) and (b), the frequency indicating a proportion of power leakage in the digital circuit;
wherein the power switch controller circuit is further coupled to an acknowledgement output of the at least one power switch, and configured to receive an acknowledgement signal to the power-on signal from the acknowledgement output of the at least one power switch, and to detect, from the reception of the acknowledgment signal, that the power supply to the circuit is powered on; and
wherein the power switch controller circuit is further configured to measure a time interval comprising at least a time between the outputting of the power-on signal to the at least one switch and the receiving of the respective acknowledgement signal from the acknowledgement output of the at least one switch, the measured time interval indicating a signal propagation delay in counting the frequency.

2. The power leakage sensor circuit of claim 1, wherein the at least one power switch, the power switch controller circuit, the frequency counter circuit, and the digital circuit are integrated into the same die.

3. The power leakage sensor circuit of claim 2, wherein the power switch controller circuit comprises a comparator configured to compare the power supply metric with the threshold.

4. The power leakage sensor circuit of claim 1, wherein the power supply metric measured for (a) and (b) indicates a power supply voltage in the digital circuit after the at least one power switch.

5. The power leakage sensor circuit of claim 1, further comprising a processing circuit configured to map said frequency to a power leakage value.

6. The power-leakage sensor circuit of claim 5, wherein the processing circuit is configured to reduce an effect of the indicated propagation delay on said frequency when mapping said frequency to a power leakage value.

7. The power leakage sensor circuit of claim 1, wherein the power switch controller circuit is switchable between a first measurement mode and a second measurement mode, wherein the power switch controller circuit is configured in first measurement mode to measure the power supply metric and in the second measurement mode to measure the time interval.

8. The power-leakage sensor circuit of claim 1, wherein the circuit comprises a plurality of sub-circuits, each sub-circuit having an independent power supply, wherein the at least one power switch comprises a plurality of power switches configured to provide the independent power supply to each of the plurality of sub-circuits, and wherein the power switch controller circuit is configured to (a) and (b) independently for each of the plurality of sub-circuits.

9. The power-leakage sensor circuit of claim 1, further comprising a test controller circuit configured to:
   i. output a scan vector to the digital circuit, the scan vector defining states for logic gates of the digital circuit, and
   ii. upon outputting the scan vector, control the power switch controller to execute (a) and (b) and the frequency counter circuit to measure the frequency,
wherein the test controller circuit is configured to repeat (i) and (ii) for a plurality of different scan vectors.

10. A computer-implemented method for testing a digital circuit, the method comprising:
outputting, by a test controller, a scan vector to the digital circuit, the scan vector defining states for logic gates of the digital circuit being tested;
controlling, by the test controller, a power leakage sensor circuit coupled with at least one power switch having a power output providing a power supply for the digital circuit, to perform the following:
   a. in response to detecting that the power supply to the digital circuit is powered on, output a power-off signal to the at least one power switch; and
   b. in response to a measured power supply metric falling below a threshold in response to the power-off signal, output a power-on signal to the at least one power switch;
counting, by using a frequency counter circuit, a frequency of executing (a) and (b), the frequency indicating a proportion of power leakage in the digital circuit;
controlling the power leakage sensor circuit to measure a time interval comprising at least a time between the outputting of the power-on signal to the at least one power switch and receiving an acknowledgement signal to the power-on signal from an acknowledgement output of the at least one power switch, the measured time interval indicating a propagation delay; and
computing, based on the counted frequency and taking into account an effect of the indicated propagation delay on said counted frequency, a power leakage metric indicating power leakage in the digital circuit.

11. The computer-implemented method of claim 10, further comprising repeating said controlling and computing for a plurality of different scan vectors.

12. A computer program product embodied on a non-transitory computer-readable medium and comprising a computer program code readable by a computer, wherein the computer program code configures the computer to carry out a computer process comprising:
outputting a scan vector to a digital circuit being tested, the scan vector defining states for logic gates of the digital circuit;
controlling a power leakage sensor circuit coupled with at least one power switch having a power output providing a power supply for the digital circuit, to perform the following:

a. in response to detecting that the power supply to the digital circuit is powered on, output a power-off signal to the at least one power switch; and
b. in response to a measured power supply metric falling below a threshold in response to the power-off signal, output a power-on signal to the at least one power switch;

counting, by using a frequency counter circuit, a frequency of executing (a) and (b), the frequency indicating a proportion of power leakage in the digital circuit;

controlling the power leakage sensor circuit to measure a time interval comprising at least a time between the outputting of the power-on signal to the at least one power switch and receiving an acknowledgement signal to the power-on signal from an acknowledgement output of the at least one power switch, the measured time interval indicating a propagation delay; and computing, based on the counted frequency and taking into account an effect of the indicated propagation delay on said counted frequency, a power leakage metric indicating power leakage in the digital circuit.

* * * * *